United States Patent [19]

Miya

[11] Patent Number: 5,530,708
[45] Date of Patent: Jun. 25, 1996

[54] ERROR DETECTION METHOD USING CONVOLUTIONAL CODE AND VITERBI DECODING

[75] Inventor: Kazuyuki Miya, Machida, Japan

[73] Assignee: Matsushita Electric Industrial Co., Ltd., Osaka, Japan

[21] Appl. No.: 243,782

[22] Filed: May 17, 1994

[30] Foreign Application Priority Data

May 20, 1993 [JP] Japan ..................... 5-118176

[51] Int. Cl.[6] .......................... G06F 11/10; H03M 13/12; H03M 13/00
[52] U.S. Cl. .................... 371/43; 371/38.1; 371/41
[58] Field of Search ............ 371/43, 37.1, 37.4, 371/38.1, 39.1, 41, 44, 45, 5.5

[56] References Cited

U.S. PATENT DOCUMENTS

| | | | |
|---|---|---|---|
| 5,005,189 | 4/1991 | Hackett, Jr. | 375/101 |
| 5,014,276 | 5/1991 | Bush et al. | 371/43 |
| 5,204,874 | 4/1993 | Falconer et al. | 375/1 |
| 5,321,725 | 6/1994 | Paik et al. | 375/39 |

FOREIGN PATENT DOCUMENTS

| | | |
|---|---|---|
| 0552781 | 7/1993 | European Pat. Off. . |
| 61-164352A | 7/1986 | Japan . |
| 3-286623 | 12/1991 | Japan . |
| 4-177917 | 6/1992 | Japan . |
| 5-316053 | 11/1993 | Japan . |
| 2238933 | 6/1991 | United Kingdom . |
| 9216065 | 9/1992 | WIPO . |

OTHER PUBLICATIONS

Electronics and Communications in Japan, Part 3, vol. 76 No.4, 1993, "Reliability of Maximum–Likelihood Decoded Codewords and Its Application to Decoding of Concatenated Codes", Hatsukazu Tanaka, pp. 71–78.

*Primary Examiner*—Roy N. Envall, Jr
*Assistant Examiner*—Emmanuel L. Moise
*Attorney, Agent, or Firm*—Spencer & Frank

[57] ABSTRACT

An error detection method is provided for receiving input data which are attached with error detection codes and then subjected to a convolutional coding operation, subjecting the input data to an error correction Viterbi decoding operation, calculating and storing branch or path metrics and, at the time of detecting an error in the error detection codes, independently detecting either one of a plurality of error detection blocks having the error present therein.

13 Claims, 4 Drawing Sheets

(1) $C_i = b_{i-2} + b_{i-1} + b_i$ (2) $C_i = b_{i-2} + b$

ERROR DETECTION METHOD USING CONVOLUTIONAL CODE AND VITERBI DECODING

BACKGROUND OF THE INVENTION

1. Field of the Invention

The present invention relates to an error detection method which uses a convolutional code as an error correction code and a Viterbi decoding as its decoding in digital data transmission or the like.

2. Description of the Related Art

Viterbi decoding is a convolutional code method. Viterbi decoding will be explained in connection with a specific example of a convolutional code C with a constraint length K=3 and a coding rate R=½ generated by a convolutional encoder circuit 30 such as is shown in FIG. 1.

The convolutional encoder 30 comprises an input terminal 40, a first shift register F0 as a first delay operator, a second shift register F1 as a second delay operator, a first adder 42, a second adder 44, a first output terminal 46, and a second output terminal 48. Applied to the input terminal 40 is a train of information signals $b_i$, $b_{(i+1)}$, . . . . The first shift register F0 receives the information signal train from the input terminal and outputs the information signal train delayed by a unit time. The second shift register F1 receives an output signal of the first shift register F0 and outputs the signal train further delayed by a unit time. Further, the first adder 42 adds together outputs of the input terminal 40, first shift register F0 and second shift register F1 and outputs its added result from the first output terminal 46 as a first output $c_i^{(1)} = b_{(i-2)} + b_{(i-1)} + b_i$. The second adder 44 adds together the input signal from the input terminal 40 and the output of the second shift register F1 and outputs a second output $c_i^{(2)} = b_{(i-2)} + b_i$ from the second output terminal 48.

The status S of the convolutional encoder 30 falls in one of the following four statuses depending on the states of the shift registers F0 and F1 shown in FIG. 1:

$S0=(0,0)$, $S1=(1,0)$, $S2=(0,1)$ and $S3=(1,1)$

A trellis chart is a representation of transition statuses of a convolutional encoder circuit varying from the initial status S0 at every moment when an information signal is input. The trellis chart of the aforementioned code C is shown in FIG. 2. In this connection, it is assumed that the input information signal train has a length of J−K+1 followed by (K−1) of 0s for its information termination. In the trellis chart, in addition, a branch-like part is called merely a "branch" while a connection of more than one branch connected in series is called a "partial path".

In the trellis chart of FIG. 2, nodes in the first row are marked by S0, nodes in the second row are marked by S1, nodes in the third row are marked by S2, and nodes in the fourth row are marked by S3. The respective nodes or encoders have output states of (0,0), (0,1), (1,0) and (1,1). The branch shown by a dotted line has an input signal of 0, while the branch shown by a solid line has an input signal of 1. Further given to the branch parts are output statuses a, b, c and d of the encoders 30. In this connection, it is assumed that a=(0,0), b=(1,0), c=(0,1) and d=(1,1), left-side components are denoted by $Ci^{(1)}$, and right-side components are denoted by $Ci^{(2)}$.

A series of connected branches leading from the initial status S0 at t=t0 to the same status at t=tj are called a "path". This path is a path corresponding to a code word of the convolutional code C. The path will be referred to herein as a "code word path" where it is necessary to avoid its confusion with a partial path.

FIG. 3 shows partial paths in the trellis chart of the code C. Subsets of the code word corresponding to the partial paths are in the illustrated example:

$CS_1=(00\ 00\ 11)$, and $CS_2=(11\ 10\ 00)$

In Viterbi decoding, each of paths $CS_1$ and $CS_2$ has a metric as an index determined on the basis of Hamming distance, Euclid distance or the like. The higher the certainty of the path, the larger is the metric of the path. Thus, when the metric of the path $CS_1$ is larger than that of the path $CS_2$ for example, the path $CS_2$ discarded. At this time, all code word paths which include the path $CS_2$ as a partial path are discarded from transmission code word candidates. Partial paths which remain without being discarded such as $CS_1$ are known as surviving paths.

From the observation of the trellis chart of FIG. 2, it will be seen that there are present two partial paths which have the same branch state as shown in FIG. 3. Thus, it will be appreciated that there are always $2^{(k-1)}$ of surviving paths at each time in a stationary state except for the both ends of the code word. And the number of surviving paths is decreased after a time $t_{j-k+2}$ and at a time $t_j$, the surviving path number becomes merely 1. And the single surviving path is decoded by trace-back into a transmission code.

FIG. 4 is a schematic block diagram of an error correction and error detection encoder which is based on a convolutional code and an error detection code. FIG. 5 shows an example of an encoder input sequence of information data to be converted into a convolutional code. FIG. 6 is a schematic block diagram of a prior-art error correction and error detection decoder which is based on Viterbi decoding and error detection decoding.

First of all, an error correction and detection encoder 31 of FIG. 4 comprises an error detection encoder circuit 32 and an error correction encoder circuit 33. More specifically, the error detection encoder circuit 32 receives input data and attaches to the input data such detection codes as cyclic redundancy check (CRC) codes (e.g., CRC1 denoted by reference numeral 34 and CRC2 denoted by numeral 35 in FIG. 5). In the example of FIG. 5, the input data is divided into three, data 1 to data 3 so that one CRC is attached to each of data 1 and data 3 in the form of divided inspection bits CRC1 and CRC2. The error correction encoder circuit 33 subjects an input signal received from the error detection encoder circuit 32 to a convolutional coding operation in an input order such as shown in FIG. 5.

Next, an error correction decoder 36 shown in FIG. 6 comprises an error correction decoder circuit 37 and an error detection decoder circuit 38. In more detail, the error correction decoder circuit 37 subjects received data to a Viterbi decoding operation. The error detection decoder circuit 38 receives a decoded result from the error correction decoder circuit 37, subjects it to a CRC error detecting operation, and outputs its error detection result together with decoded data. For example, the error detection decoder circuit 38 outputs an error detection flag 1 when detecting an error and an error detection flag 0 when failing to detect any error.

In the aforementioned error detection method, however, CRC encoding is carried out from both of data 1 and data 3 so that only the CRC error detection makes it impossible to perform error detection over the data 1 and data 3 independently, even when the data 1 has no error and the data 3 alone has an error or errors. For this reason, in the Viterbi decoding, in spite of the fact that an error in the decoded data occurs with a high probability in a burst manner (in the illustrated example, errors take place concentratedly in only one or two of the data 1 through data 3), since this error cannot be distinguished from the generation of errors in both the data 1 and data 3, it is disadvantageously impossible to realize efficient error detection. To avoid this, it is considered to attach a respectively independent CRC code to each of the data 1 and data 3. This method can attain independent error detection, but this also undesirably involves an increased number of redundant bits.

Kawabe et al. disclose an error detection system using convolutional code and Viterbi decoding to detect burst errors in JP-A-61-164352 (or JP-B-453337). Kawabe et al. propose to introduce detecting lengths of burst errors and durations of error-free regions and informing the lengths and the durations to the transmitter side of the system in order to select an adequate method for the transmission path and to repeat transmission. Kawabe et at. require an additional detecting device for lengths of burst errors and error-free durations.

SUMMARY OF THE INVENTION

It is an object of the present invention to provide an error detection method which resolves the above problems in the prior art and which uses, in addition to an error detection code, stored branch metrics or path metrics in Viterbi decoding to realize efficient error detection over a plurality of error detection blocks independently of each other.

In accordance with an aspect of the present invention, the above object is attained by an error correction decoder, in which branch metrics, obtained for respective received signal trains, or path metrics obtained for respective statuses based on add-compare-select (ACS) operation, are previously stored to, in its Viterbi decoding perform decoding, operation of an error detection code. When detecting an error, the error correction decoder uses the error detection code and the branch or path metrics previously stored in the Viterbi decoding to carry out error detection on an every block basis.

Accordingly, in accordance with the present invention, a signal receiver can perform, with use of the error detection code and the Viterbi coded metrics, error detection over a plurality of error detection blocks independently, each block having an error detection unit including fewer bits than that of the error detection encoding.

DESCRIPTION OF THE PREFERRED EMBODIMENTS

Figure 7:
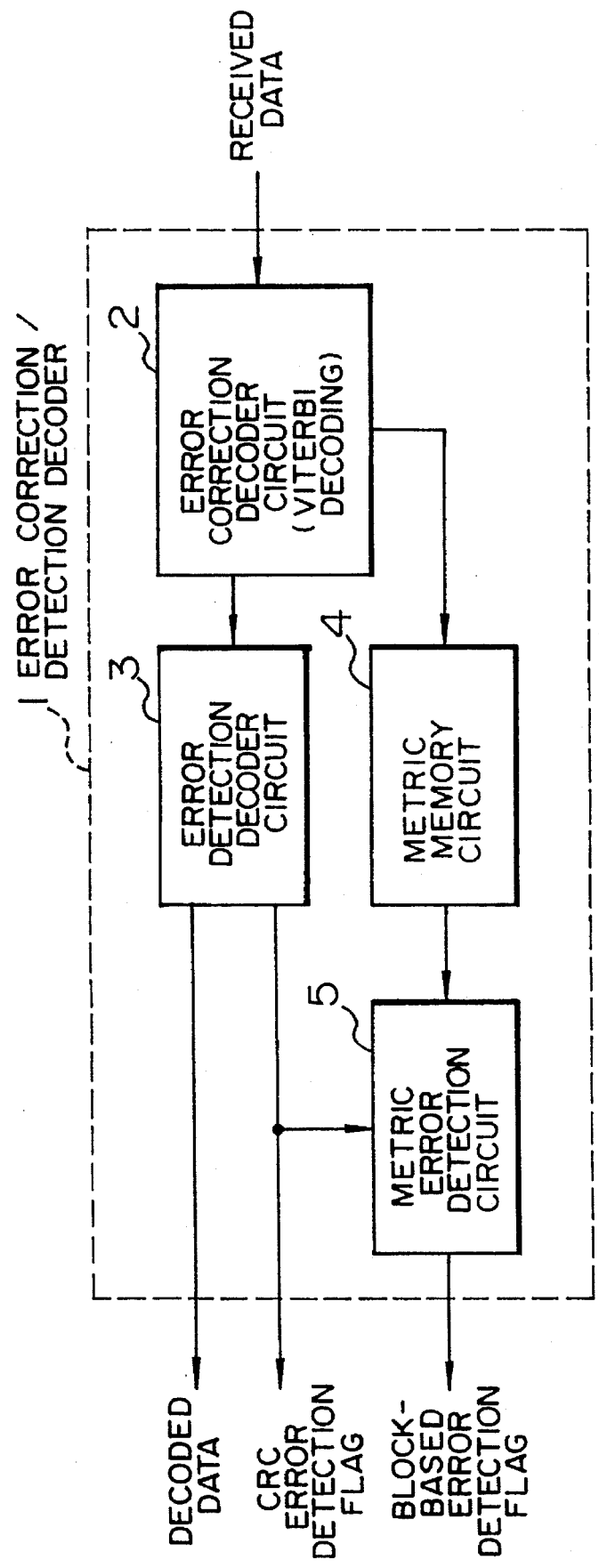
FIG. 7 is a block diagram of an error correction decoder in accordance with an embodiment of the present invention.

Referring first to FIG. 7, there is shown a block diagram of an error correction and error detection decoder circuit 1 in accordance with an embodiment for carrying out a method of the present invention.

The error correction and detection decoder 1 of FIG. 7 includes an error correction decoder circuit 2 for performing error decoding operation on received data based on Viterbi decoding, an error detection decoder circuit 3 for performing CRC error detection on a decoded result of the error correction decoder circuit 2, a metric memory circuit 4 for storing therein branch metrics obtained for respective received signal trains or path metrics obtained for respective statuses through add-compare-select (ACS) operation in the Viterbi decoding, and a metric error detection circuit 5 for performing error detection with use of an error detection code (CRC error detection flag) decoded by the error detection decoder circuit 3 and the branch or path metrics of the metric memory circuit 4.

Figure 1:
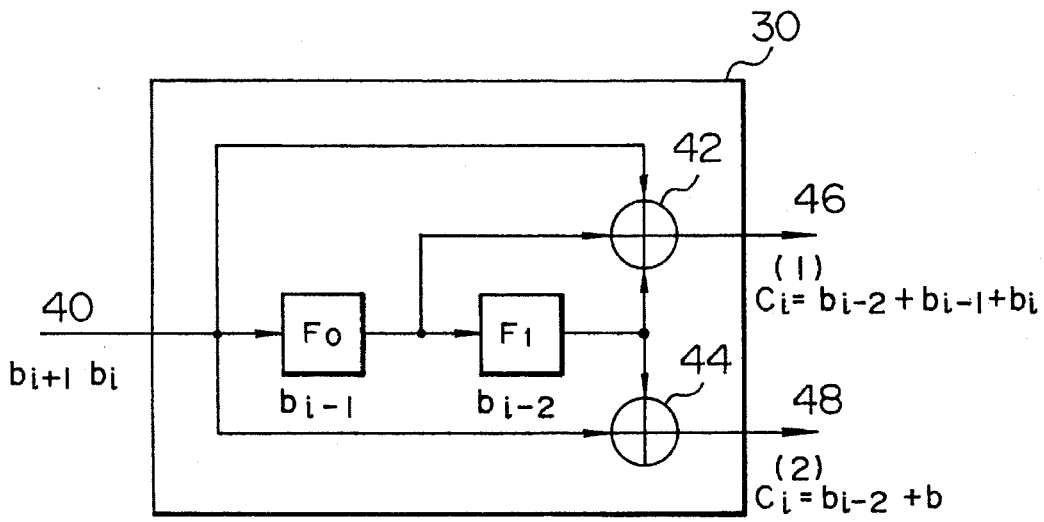
FIG. 1 shows an example of a prior art error correction encoder circuit.
Figure 2:
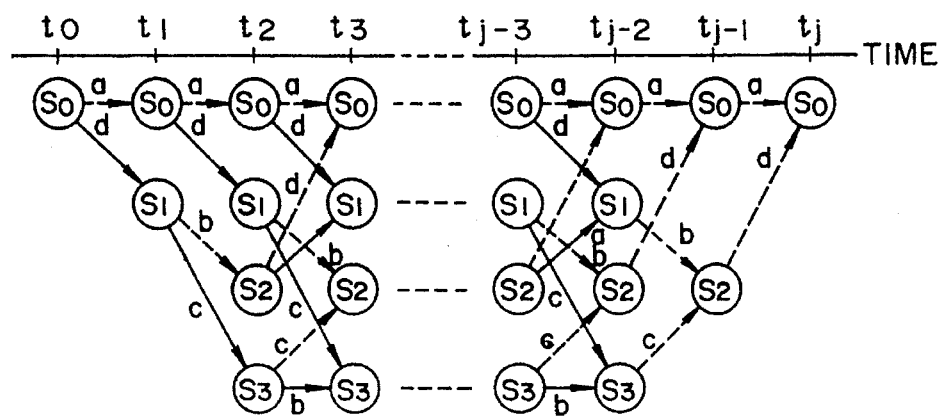
FIG. 2 shows an example of a trellis chart of the prior art.
Figure 3:
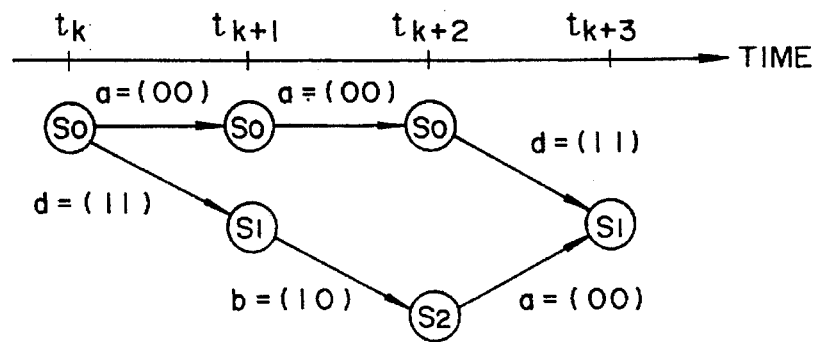
FIG. 3 shows an example of two partial paths joined to each other in the prior art.
Figure 4:
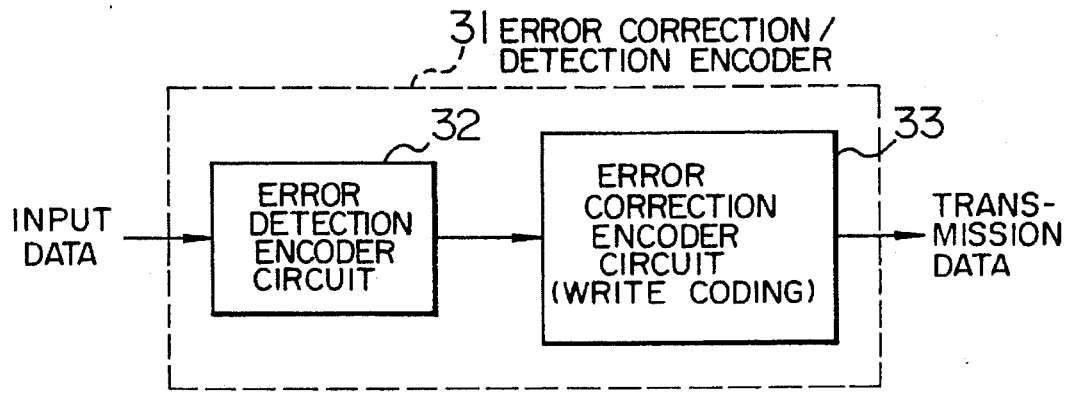
FIG. 4 shows a block diagram of a prior art error correction encoder.
Figure 5:
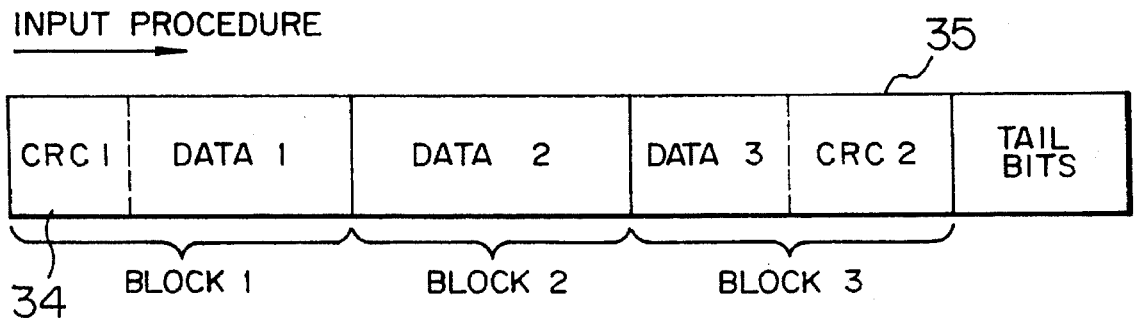
FIG. 5 shows an example of an encoder input sequence of information data to be subjected to a convolutional coding operation.
Figure 6:
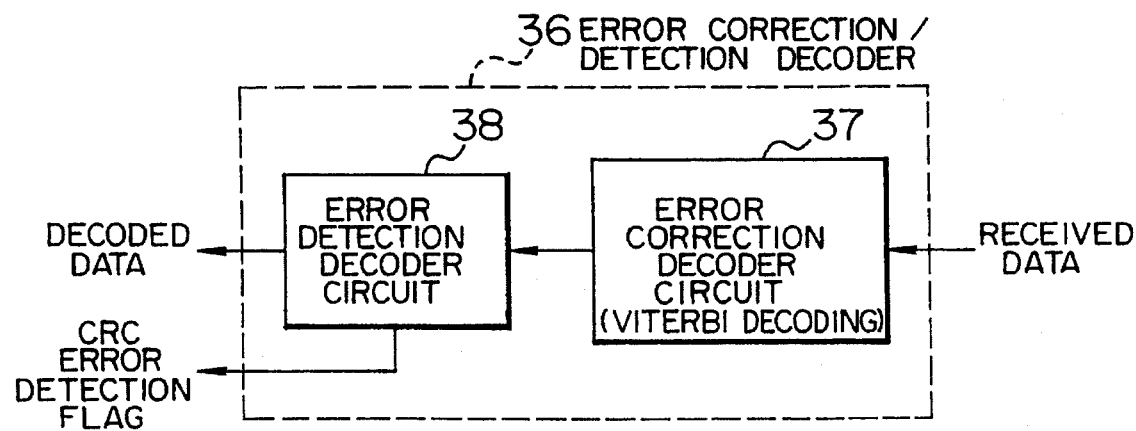
FIG. 6 is a block diagram of a prior art error correction decoder.

The error correction encoder circuit of the present embodiment is similar to the prior art of FIG. 4 and information data used to be convolutionally decoded is similar to the information data shown in FIG. 5.

In FIG. 5, as error detection blocks having a bit number less than the bit number of an information part to be subjected to an error detection coding operation, three error detection blocks are defined, as follows:

Block 1: CRC1+Data 1

Block 2: Data 2

Block 3: Data 3+CRC2

It is assumed in this example that the blocks 1 to 3 have substantially the same bit numbers (which are not necessarily required to be identical). Further, the information data has a tail bit portion indicative of information termination, but the tail bit portion will not be subjected to the error detection.

As parameters for use in metric error detection, 5 parameters below are defined as follows:

Mf: Path metric of the finally survived path

Mpi: Partial path metric of the finally survived path at each block i

Maxi: Maximum of path metrics in the final received signal train at each block i Mini: Minimum of path metrics in the final received signal train at each block i Mdi: Maximum minus minimum of path metrics in the final received signal train at each block i where i=1–3.

These parameters are found through the Viterbi decoding and then stored in the metric memory circuit 4.

Further, four thresholds are defined as thresholds in the error detection algorithm as follows.

MF: Threshold for Mf

A: Threshold for Mdi

B: First threshold for Mpi

C: Second threshold for Mpi

Furthermore, the partial path metrics Mpi (i=1–3) for each block are set to be (Mps, Mpt, Mpu) (where s, t, u=1–3) in its decreasing metric order and an error detection flag for each block is set to be i (i=1–3).

Figure 8:
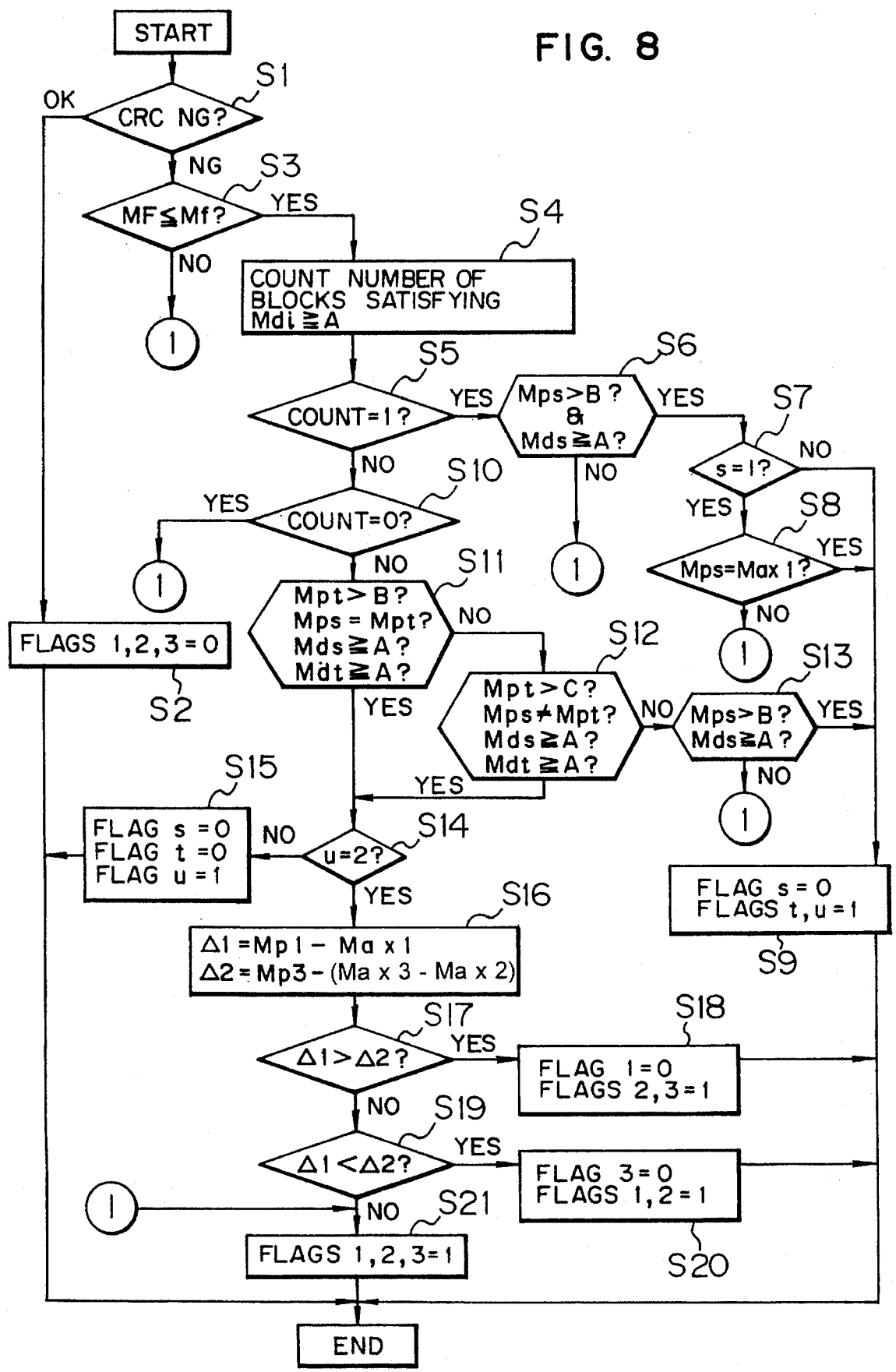
FIG. 8 is a flowchart for explaining the operation of a metric error detection circuit in accordance with an embodiment of the present invention.

Shown in FIG. 8 is a flowchart for explaining the operational process of the metric error detection circuit 5 of the error correction and detection decoder 1 in accordance with the present embodiment.

In FIG. 8, it is judged in step S1 whether or not CRC error detection was carried out. When judged to be OK (no error), the process in step S2 sets all flags 1 to 3 to be all 0s and outputs them. When judging NG (in the presence of an error), the process in step S3 first judges whether or not Mf is equal to or greater than its threshold (MF) to determine which block is erroneous. If Mf is smaller than the threshold MF, then the process proceeds to step S21 to set all the flags at "1" and then output them, since there is a high probability that all blocks are erroneous. If Mf is equal to or greater than the threshold MF, then the process proceeds to step S4 to count the number of blocks which have Mdi values equal to or greater than A and which are considered to possibly have no error. In step S5, the process judges whether or not the value counted at step S4 is "1". In the case of the counted value of "1", the process judges in step S6 whether or not maximum one Mps of partial path metrics of blocks in the finally survived path is greater than the first threshold B and difference Mds between the maximum and-minimum ones of the path metrics of that block in the final received signal train is equal to or greater than the threshold A with a high reliability.

In step S6, the determination of NO causes the process to go to step S21 and to output all flags of all "1", since the block having the maximum partial path metric may have an error with a high probability.

When determining in step S6 that relationships of Mps>B and Mds≧A are satisfied, the process proceeds to step S7 to determine whether or not s is 1, i.e., whether or not the block having the maximum partial path metric corresponds to the block 1. In the case of s=1, the process goes to step S8; whereas in the case of s is not 1, the process goes to step S9. In step S8, the process judges whether or not maximum Mps of the path metrics of the block 1 in the final received signal train is equal to Max1. In the case of Mps=Max1 indicative of no error in the block 1, the process outputs in step S9 the flag 1 set at "0" and the other flags 2 and 3 set at "1". The determination of NO in step S8 causes the process to proceed to step S21 and to output all the flags set at all "1", because of possibly low reliability of the block 1.

In step S5, meanwhile, when determining that the counted value is not 1, since this means that there is no reliable block, the process proceeds to step S10 and outputs all the flags set all at "1". The determination of the counted value of not 0 causes the process to judge in step S11 whether or not Mpt>B, Mps=Mpt, Mds≧A and Mdt≧A, that is, whether or not the secondly larger partial path metric is the same as the maximum partial path metric and greater than the first threshold and a difference between the maximum and minimum of the path metrics of the associated block in the final received signal train exceeds their thresholds. A NO determination in step S11 causes the process to go to the next step S12 to determine whether or not Mpt>C, Mps≠Mpt, Mds≧A and Mdt≧A, that is, whether or not the secondly larger Mpt is greater than the second threshold C. The determination of NO in step S12 causes the process to proceed to step S13 to determine whether or not Mps>B and Mds≧A with respect to the parameters of the block having the maximum partial path metric. Satisfaction of the above conditions causes the process to determine that the block having the maximum partial path metric has no error, which results in the process going to step S9 and outputting the flag s set at "0" and the flags t and u both set at "1". Determination of NO in step S13 (which means that any of the blocks are erroneous) causes the process to carry out the processing of step S21.

When determining a yes in step S11, or a NO in step S11 and a yes in step S12, the process proceeds to step S14 to judge whether or not u=2. When u is not 2, this means that the difference between the maximum and minimum of the path metrics with respect to all the blocks 1–3 in the final received signal train exceeds their threshold but the block having the maximum path metric in the finally survived path and the secondly larger block have partial path metrics greater than the threshold. In other words, since this means that the block having the minimum partial path metric is erroneous, the process proceeds to step S15 and outputs the flags s and t set both at "0" and the flag u set at "1". When u=2, the circuit judges that the data 1 and 2 to be subjected to the CRC error detection should not be both OK, and proceeds to step S16.

In step S16, the process calculates a difference Δ1 (=Mp1–Max1) between the partial path metric of the first block 1 of the finally survived path and maximum one of the path metrics of the block 1 in the final received signal train, and also calculates a difference Δ2 (=Mp3–(Max3–Max2)) between the partial path metric of the last block 3 of the final residual path and a difference between maximum ones of the path metrics of the blocks 2 and 3 in the final received signal train, to thereby find a difference between the partial metric of the finally survived path and maximum one of the partial path metrics of each block. The process judges in step S17 whether or not a relationship of Δ1>Δ2 is satisfied. When determining that the relationship of Δ1>Δ2 is satisfied, the process judges that no error is present in the block 1, goes to step S18, and outputs the flag 1 set at "0" and the flags 2 and 3 both set both at "1".

When determining in step S17 that the relationship of Δ1>Δ2 is not satisfied, the process proceeds to step S19 to judge whether or not a relationship of Δ1<Δ2 is satisfied. Determination of Δ1<Δ2 causes the process to judge that no error is present in the block 3 and to go to step S20 to output the flag 3 set at "0" and the flags 1 and 2 set both at "1". When the process judges that the relationship of Δ1<Δ2 is not satisfied, this means that errors are present in both the blocks 1 and 3, which results in the process proceeding to step S21 and outputting all the flags 1, 2 and 3 set all at "1".

In accordance with the aforementioned embodiment of the present invention, as will be seen from the block diagram of FIG. 7 and the flowchart of FIG. 8, a signal transmitter side subjects all or part of input data to an error detection coding operation to form encoded data and further subjects the encoded data as information bits to a correction coding operation with use of the convolutional code, and then transmits it; whereas a signal receiver subjects the input data to an error correction Viterbi decoding operation, in which case the values of branch metrics obtained in each received signal train and the values of path metrics obtained through the ACS operation with respect to each status are previously stored in the metric memory circuit 4 so that combination of the stored values of the branch and path metrics and the CRC error detection code of the error detection decoder circuit 3 enables determination or identification of any of a plurality of divided blocks in the input data having an error or errors present therein.

In this way, in accordance with the present invention, error occurrence positions can be specified independently for each of the blocks corresponding to a plurality of divisions of the data subjected to the error detection coding, while suppressing an increase in the redundancy. Further, even when an error takes place in any of the plurality of blocks in the input data, the error block can be identified.

It will be appreciated that, in the present invention, the aforementioned thresholds MF, B and C are not necessarily set at fixed values and may be controllably changed in response to the line state, CRC error detection rate, car speed, etc.

It will also seen in the present embodiment that the CRC coding is carried out over the input data 1 and 3 as shown in FIG. 5 but may be carried out over the entire input data.

What is claimed is:

1. An error detection method for detecting an error in transmission data, the transmission data being obtained by adding error detection codes to input data to convert the input data into encoded data having a predetermined number of bits and then subjecting the encoded data as information bits to an error correction coding operation using convolutional code, said method comprising steps of:

dividing the transmission data into a plurality of error detection blocks each of which includes consecutive received signal train elements in Viterbi decoding, the consecutive received signal train elements having a smaller number of bits than the predetermined number of bits;

subjecting the transmission data and the consecutive received signal train elements in each error detection block to an error correction Viterbi decoding operation to obtain predetermined parameters for an error detection using metrics, the metrics including one of branch metrics for the consecutive received signal train elements in each error detection block, and path metrics through add-compare-select operation for each state;

storing the obtained predetermined parameters;

decoding the error detection codes in the transmission data after said error correction Viterbi decoding operation, and then detecting using the decoded error detection codes whether or not there is an error in the transmission data after said error correction Viterbi decoding operation;

detecting, using the stored predetermined parameters, whether or not there is an error in the consecutive received signal train elements in each error detection block, when an error in the transmission data after said error correction Viterbi decoding operation is detected.

2. An error detection method as set forth in claim 1, wherein the predetermined parameters include a partial path metric for each error detection block of a finally survived path in said Viterbi decoding.

3. An error detection method as set forth in claim 1, wherein the predetermined parameters include at least one of maximum and minimum values of path metrics of a finally received signal train in each error detection block for each state and a difference between the maximum and minimum values.

4. An error detection method as set forth in claim 1, wherein the predetermined parameters include a partial path metric for each error detection block of a finally survived path in said Viterbi decoding, and include at least one of maximum and minimum values of the path metrics of a finally received signal train in each error detection block for each state and a difference between the maximum and minimum values.

5. An error detection method as set forth in claim 1, wherein the predetermined parameters include a path metric of a finally survived path in said Viterbi decoding.

6. An error correction and detection decoder for detecting an error in transmission data, the transmission data being obtained by adding error detection codes to input data to convert the input data into encoded data having a predetermined number of bits and then subjecting the encoded data as information bits to an error correction coding operation using convolutional code, said decoder comprising:

an error correction decoder circuit for dividing the transmission data into a plurality of error detection blocks each of which includes consecutive received signal train elements in Viterbi decoding, and for subjecting the transmission data and the consecutive received signal train elements in each error detecting block to an error correction Viterbi decoding operation to obtain predetermined parameters for an error detection using metrics, the consecutive received signal train elements having a smaller number of bits than the predetermined number of bits;

a memory circuit for storing the obtained predetermined parameters;

an error detection decoding circuit for decoding the error detection codes which are included in the transmission data after the error correction Viterbi decoding operation, for detecting, using the decoded error detection codes, whether or not there is an error in the transmission data after the error correction Viterbi decoding operation, and for outputting an error detection flag for indicating whether or not there is an error in the transmission data after the error correction Viterbi decoding operation;

a metric error detection circuit for taking in the error detection flag from said error detection decoding circuit and the predetermined parameters from said memory circuit, for detecting, using the predetermined parameters, whether or not there is an error in the consecutive received signal train elements in each error detection block, and for outputting block error detection flags each of which indicates whether or not there is an error in the consecutive received signal train elements in each error detection block, when the error detection flag indicates that an error in the transmission data after the error correction Viterbi decoding operation has been detected.

7. An error correction and detection decoder for detecting an error in transmission data, the transmission data being obtained by adding error detection codes to input data to convert the input data into encoded data having a predetermined number of bits and then subjecting the encoded data as information bits to an error correction coding operation using convolutional code, said decoder comprising:

error correction decoder means for dividing the transmission data into a plurality of error detection blocks each of which includes consecutive received signal train elements in Viterbi decoding, and for subjecting the transmission data and the consecutive received signal train elements in each error detecting block to an error correction Viterbi decoding operation to obtain predetermined parameters for an error detection using metrics, the consecutive received signal train elements having a smaller number of bits than the predetermined number of bits;

memory means for storing the obtained predetermined parameters;

error detection decoding means for decoding the error detection codes which are included in the transmission data after the error correction Viterbi decoding operation, for detecting, using the decoded error detection codes, whether or not there is an error in the transmission data after the error correction Viterbi decoding operation, and for outputting an error detection flag for indicating whether or not there is an error in the transmission data after the error correction Viterbi decoding operation;

metric error detection means for taking in the error detection flag from said error detection decoding means and the predetermined parameters from said memory means, for detecting, using the predetermined parameters, whether or not there is an error in the consecutive received signal train elements in each error detection block, and for outputting block error detection flags each of which indicates whether or not there is an error in the consecutive received signal train elements in each error detection block, when the error detection flag indicates that an error in the transmission data after the error correction Viterbi decoding operation has been detected.

8. The error correction and detection decoder according to claim 7, wherein said error detection decoding means is further for outputting decoded data.

9. The error correction and detection decoder according to claim 7, wherein the error detection flag output by said error detection decoding means comprises a CRC error detection flag.

10. The error correction and detection decoder according to claim 7, wherein the predetermined parameters include a partial path metric for each error detection block of a finally survived path in said Viterbi decoding.

11. The error correction and detection decoder according to claim 7, wherein the predetermined parameters include at least one of maximum and minimum values of path metrics of a finally received signal train in each error detection block for each state and a difference between the maximum and minimum values.

12. The error correction and detection decoder according to claim 7, wherein the predetermined parameters include a partial path metric for each error detection block of a finally survived path in said Viterbi decoding, and include at least one of maximum and minimum values of the path metrics of a finally received signal train in each error detection block for each state and a difference between the maximum and minimum values.

13. The error correction and detection decoder according to claim 7, wherein the predetermined parameters include a path metric of a finally survived path in said Viterbi decoding.

* * * * *